(12) United States Patent
Andrys et al.

(10) Patent No.: US 6,734,729 B1
(45) Date of Patent: May 11, 2004

(54) CLOSED LOOP POWER AMPLIFIER CONTROL

(75) Inventors: Paul R. Andrys, Swisher, IA (US); David S. Ripley, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/109,985

(22) Filed: Mar. 30, 2002

Related U.S. Application Data

(60) Provisional application No. 60/280,709, filed on Mar. 30, 2001.

(51) Int. Cl.[7] .............................................. H03G 3/20
(52) U.S. Cl. .................... 330/129; 330/107; 330/207 P
(58) Field of Search ................................. 330/107, 129, 330/207 P, 279, 298, 136

(56) References Cited

U.S. PATENT DOCUMENTS 3,879,672 A * 4/1975 Milanes ........................ 330/29
6,081,558 A * 6/2000 North .......................... 375/316

* cited by examiner

Primary Examiner—Henry Choe
(74) Attorney, Agent, or Firm—The Eclipse Group; Francisco A. Rubio-Campos

(57) ABSTRACT

The invention includes an integrated circuit chip having a closed loop control module. The closed loop control module includes a power amplifier coupled to a feedback control circuit. The power amplifier linearly amplifies a communication signal based on a modified control signal received from the feedback circuit. To produce the modified control signal, the feedback circuit may receive from the power amplifier a passive representation of the power amplifier collector current or an active representation of the power amplifier collector current. The feedback control circuit takes the collector current representative signal received from the power amplifier and compares to a voltage control signal. The comparison results in a signal that is passed through a loop integrator to create the modified control signal use to control the amplification of the communication signal in the power amplifier. A feedback saturation detecting circuit may be fixed about the loop integrator to prevent saturation.

6 Claims, 14 Drawing Sheets

CLOSED LOOP POWER AMPLIFIER CONTROL

CROSS-REFERENCE TO RELATED APPLICATIONS AMPLIFIER CONTROL,

This application claims the benefit of Provisional Patent Application Serial No. 60/280,709, filed on Mar. 30, 2001, and entitled CLOSED LOOP POWER AMLIFIER CONTROL,

BACKGROUND OF THE INVENTION

1. Technical Field

The invention relates to saturated power amplifiers in which the output power of the power amplifier is stabilized against environmental and device-to-device variations through a feedback control circuit.

2. Related Art

In today's society, both the presence and use of communication systems are increasing at a rapid pace. Wireless and broadband communication systems and infrastructures continue to grow. This acceleration has created a strong and ever-growing market for electronic equipment that employs more powerful, efficient, and inexpensive communication components and devices.

Electronic equipment such as computers, wireless devices, broadband devices may communicate with one another by passing transmission signals through free-space space (i.e., air and space) and through guided mediums such as wire, cable, microwave, millimeter wave, sonic, and optical connections. These transmission signals may experience a variety of processing steps during their communication including the process of amplifying the transmission signals.

As an example, in order to amplify the transmission signals in a mobile telephone (also typically known as a "cellular telephone," "cellular phone" or "cellphone"), a cellphone manufacturer may purchase, from another vendor, an integrated circuit chip that includes an amplifier (such as a power amplifier). Typically this power amplifier will vary the power of a transmission signal from a power level at an input of the power amplifier to a new desired power level at an output of the power amplifier, in response to a received power control signal (such as a power control voltage) from a supply source in the cellphone. Unfortunately, power amplifiers have certain characteristics (including gain, linearity, saturation point, peak-power, efficiency and other electrical properties that include all the parameters of the transistors in the power amplifier) that vary from power amplifier to power amplifier (i.e., device-to-device).

These characteristics are typically susceptible to environmental variations such as changes in temperature, power supply voltage and process changes (such as the variations caused in the manufacturing process) and vary from device-to-device. In order to compensate for these variations in characteristics, at present, cellphone manufacturers typically test each power amplifier individually and then generate software algorithms and/or custom calibration tables that compensate for the variations.

To this end, cellphone manufacturers will generally utilize a control chip (that is separate from the power amplifier and may include the software algorithms and/or custom calibration tables) that performs a calibration process on the power amplifier. Additionally, the vendors spend time calibrating and testing each power amplifier to ensure that each power amplifier complies with system specifications provided by the cellphone manufacturer.

Moreover, on purchase and installation of a vendor supplied power amplifier, the cellphone manufacturer must spend time calibrating the working relationship between the control chip and the power amplifier to ensure that the relationship complies with system specifications. As a result of this manufacturer calibration process, the power amplifier output power may vary consistently and within specifications with an applied power control voltage profile.

A problem with the conventional testing process performed by the vendor and the calibration processes performed by the vendor and the manufacturer is that they generally are labor intensive, subject to many errors, and generally increase the cost of the manufactured products. It is desirable to minimize the problems associated with incorporating a vendor supplied power amplifier into a communication device.

SUMMARY

A system is disclosed that works through local feedback, enabling a power amplifier with a control voltage output power characteristic that is invariant to environ mental and part-to-part process variations. Broadly conceptualized, the system may include a power amplifier coupled to a local controller. A power control voltage is applied to the local controller along with a feedback signal proportional to the power amplifier output power. The local controller compares these two signals. This results in an error voltage that is applied to the power amplifier control voltage input. Through the feedback loop action, the error voltage is minimized causing the amplifier output power to follow the applied power control voltage without sensitivity to environmental (i.e., temperature, input power, or supply voltage) or power amplifier variations.

The signal that is fed back into the local controller may be either a direct or indirect representation of the power amplifier output power. For example, a direct representation may be the direct current (DC) voltage resulting from a power detector fed by a directional coupler at the power amplifier output. Under closed loop control, the output power control characteristic would be proportional to the input control voltage. Indirect representations of the output power may be the DC supply voltage, base, or collector currents of the power amplifier. Another indirect representation may be the detected RF voltage at the power amplifier output or at any voltage node along the output impedance match. Since these indirect signals are proportional to the square-root of the power, the closed loop output power control characteristic is non-linear with respect to the input control voltage.

Passing either a direct or indirect power feedback signal through a logarithmic amplifier before applying it to the error amplifier results in an output power control characteristic that has a linear-in-decibel (linear-in-dB) relationship with respect to the input control voltage. The same linear-in-dB characteristic can also be achieved by passing the input control voltage through an exponential amplifier before application to the error amplifier.

At high power outputs, components of the above system such as the power amplifier may reach a saturation point and cease to work properly. To extend the closed loop operational range of the power amplifier for example, a saturation detection feedback loop may be incorporated into the system to alter the power control voltage applied to the power amplifier.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION OF THE INVENTION

The invention relates to amplifiers, and in particular to saturated power amplifiers in which the output power is varied by an applied direct current bias or by a control voltage. The control voltage output power characteristic is stabilized against environmental and device-to-device variations through an integrated feedback control circuit. This approach frees a power amplifier user from the task of compensating for these variations to meet typical system specifications.

Figure 1:
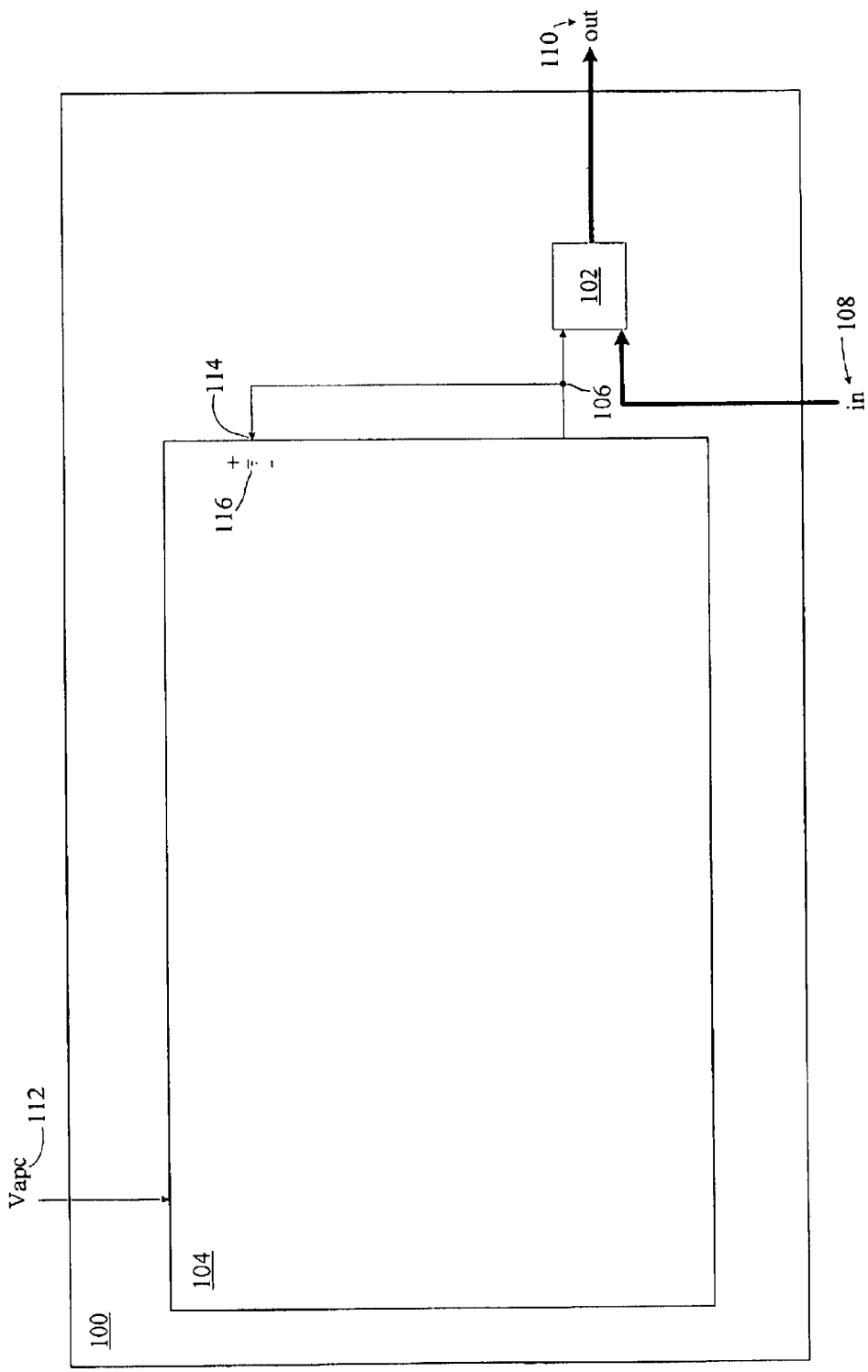
FIG. 1 illustrates a block diagram 100.

FIG. 1 illustrates a block 100 (also known as "a closed loop control module" and "control module"). As an example embodiment, the block 100 may be part of any microelectronic multi-chip module ("MC") device having interconnected semiconductor integrated circuits and discrete components. Moreover, the block 100 may be part of a power amplifier module. Further, the block 100 may be an integrated circuit chip and may be incorporated into a product, including converged broadband data stream devices, mobile telephones (also know as "cellular telephones," "cellular phones," "cellphones" and "mobile phones", and non-patented products.

The block 100 may include an amplifier 102 and a controller circuit 104. The amplifier 102 is in signal communication with the controller circuit 104. The amplifier 102 may be any device that increases the magnitude of a variable quantity, especially the magnitude of signal voltage, power, or current, without altering any other quality. For example, the amplifier 102 may be a power amplifier. By way of explanation and not limitation, the amplifier 102 may be referred to as a power amplifier 102. Power amplifier 102 may include at least on transistor having a base, collector and emitter in the case of a bipolar junction transistor ("BJT") or a gate, source and drain in the case of a field-effect transistor ("FET").

The power amplifier 102 may be also a single/multi-band power amplifier. The power amplifier 102 may be coupled to a supply current (not shown) and may receive a node signal (such as a node voltage) 106 as energy that may amplify the power level of an input signal 108 to produce an output signal 110. The power level of the output signal 110 may be a linear amplification of the power level of the input signal 108. An increase in signal power (gain) may be expressed as the ratio of the output signal 110 to the input signal 108.

The node signal 106 may be related to a power control voltage (Vapc) 112. The controller circuit 104 may include an input (also known as a "feedback signal") 114 coupled to receive, as a voltage 116, either the node signal 106 or a representation of the node signal 106. The controller circuit 104 may utilize the voltage 116 to modify or calibrate the power control voltage 112 to produce the node signal 106. As calibrated, the node voltage 106 helps provide linear control over the power amplifier 102.

In other example embodiments, the components of block 100 may comprise an integrated circuit technology selected from any group, such as for example silicon, silicon-germanium, gallium arsenide ("GaAs"), complementary metal oxide semiconductor ("CMOS"), and Bipolar CMOS ("BiCMOS"). GaAs, for example, is a group II–IV compound semiconductor material that may be utilized for making optoelectronic devices and high-frequency ICs. GaAs generally has a higher electron mobility than silicon, thus having the capability of producing higher-speed devices. Moreover, electrons in GaAs may travel at twice the speed of those of silicon.

By way of comparison, CMOS is a metal oxide semiconductor ("MOS") technology in which both P-channel and N-channel components may be fabricated on the same die to provide integrated circuits that utilizes less power than those made with other MOS or bipolar processes. Moreover, Bipolar BiCMOS is an IC technology combining the linearity and speed advantages of bipolar and the low-power advantages of CMOS on a single IC. BiCMOS can operate at either emitter-coupled-logic ("ECL") or transistor-transistor-logic ("TTL") levels, and is ideal for mixed-signal devices.

As described more fully below, the embodiments of the invention include a variety of power control techniques. Various types of local feedback are employed, each being based on sensing a current. These techniques result in a power amplifier with a control voltage output power characteristic that is invariant to environmental and device-to-device process variations.

Figure 2:
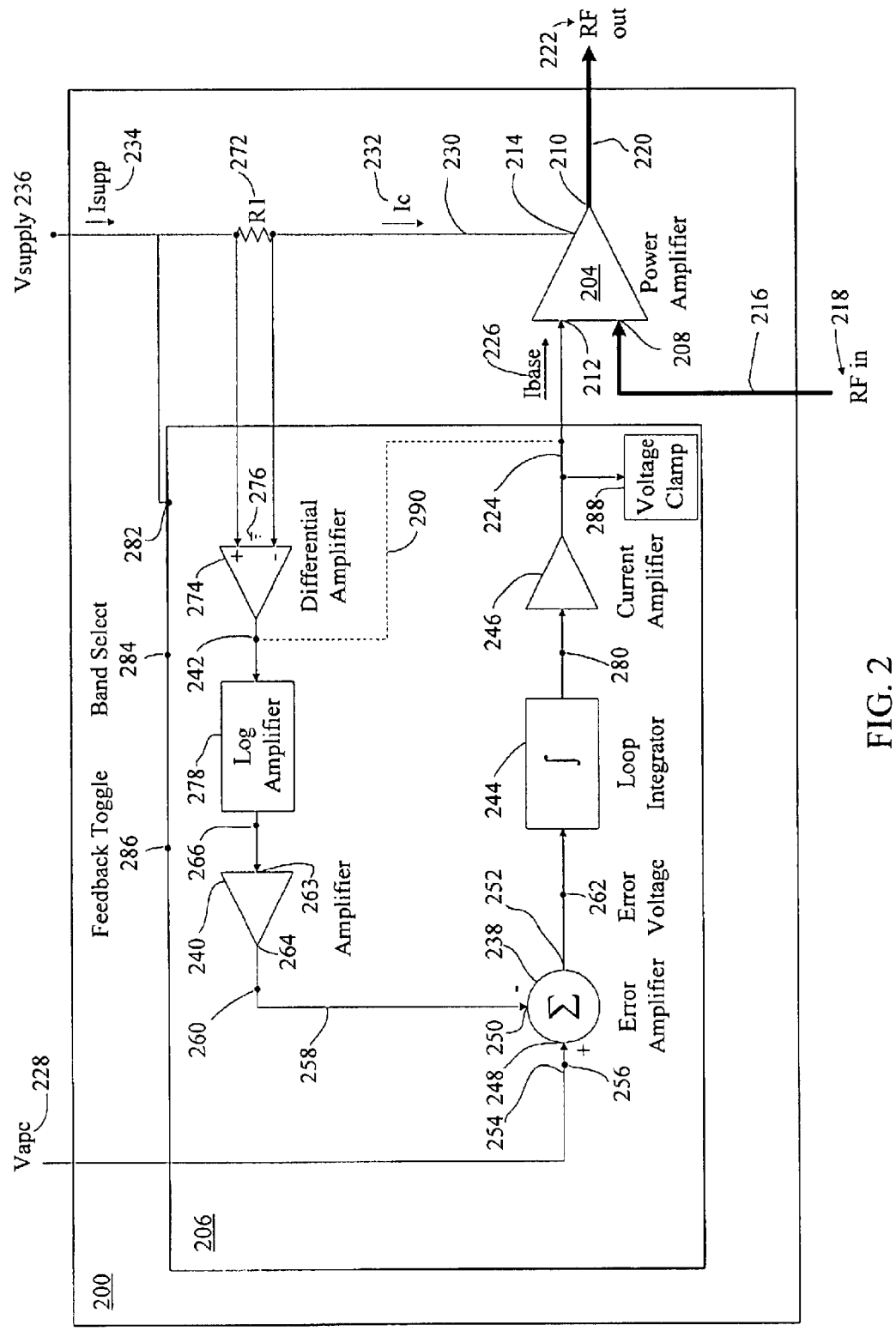
FIG. 2 illustrates a system 200 as an exemplar implementation of the block 100 of FIG. 1.

I. Indirect Sense Power Control Technique: Collector Current Sense With Logarithmic Feedback FIG. 2 illustrates a system 200 as an exemplar implementation of the control module block 100 of FIG. 1. The system 200 relates to the indirect sense power control technique of sensing collector current with an example transistor within the power amplifier 102, FIG. 1, and utilizing logarithmic feedback. In one embodiment, the system 200, FIG. 2, maybe disposed in a module that is part of a structure having at least two integrated circuits electrically connected to a common circuit base and interconnected by conductors in that base. Alternatively, the system 200 may be a multi-chip module ("MCM").

The system 200 may include a power amplifier 204 and a controller 206 in signal communication with power amplifier 204. As seen in FIG. 2, the power amplifier 204 may include an input 208, an output 210, a base 212, and a collector 214.

The input 208 may be coupled to a bus 216 to receive a signal 218. The signal 218 may be a modulated radio frequency ("RF") signal. Moreover, the signal 218 may be any range of electromagnetic waves with a frequency or wavelength suitable for utilization in communication such as radio communication, microwave communication, millimeter wave communication, and optical communication. Further, the frequency bands within which the signal 218 resides may vary such that the power amplifier 204 may be viewed as a multi-band power amplifier ("Multi-Band PA").

The output 210 may be coupled to a bus 220. Accordingly, the Output 210 and the bus 220 may be configured to distribute a signal 222 to a subsequent amplifier (which may simply be a transistor) stage or to other circuitry. In one embodiment, the signal 222 is a linear amplification of the signal 218.

The base 212 may be coupled to a bus 224 to receive a base current ("Ibase") 226. The base current 226 may originate from a power control voltage ("Vapc") 228. In one embodiment, the power control voltage 228 is a voltage supplied from a source (not shown) that is external to the system 200.

The collector 214 may be coupled lo a bus 230 to sink a collector current ("Ic") 232. The collector current 232 may be based on a supply current ("Isupp") 234 that originates from a voltage supply ("Vsupply") 236.

As noted above, the system 200 may include the controller circuit (also known as "controller") 206. The controller 206 may be thought of as a power amplifier controller ("PAC") that works with the power amplifier 204 to form a closed loop power amplifier controller ("CLPAC"). Included with the controller 206 may be an error amplifier 238, an amplifier 240, a node 242, a loop integrator 244, and a current amplifier 246.

The amplifier 240 may be any device that produces an amplification of a signal. The amplifier 240 may include an input 263 and an output 264. The input 263 may be coupled to both receive and amplify a voltage 266 to produce a voltage 260 at the output 264. The voltage 266 may be based on the node voltage 242.

To obtain the node voltage 242, the system 200 of FIG. 2 may further include a resistor ("RI") 272 and a differential amplifier 274. Both the resistor 272 and the differential amplifier 274 may be connected between the voltage supply 236 and the collector 214 of the power amplifier 204 so as to be in parallel with one another.

Under this arrangement, the resistor 272 may be thought of as a series collector resistor.

Both the resistor 272 and the differential amplifier 274 may be implemented in a variety of ways. For example, the resistor 272 may be any electrical device having components that resist the flow of electrical current. The resistor 272 is not limited to one component but may be a combination of discrete components. Further, the resistor 272 may be a variable resistor, such as at least one of a potentiometer, a voltage divider, and a rheostat. As for the differential amplifier 274, the differential amplifier 274 may be any device that amplifies the difference between two input signals: (−) and (+).

In operation, the collector 214 may sink the collector current 232 to produce the output 222. As the collector 214 sinks the collector current 232, the supply current 234 passes through the resistor 272 to develop a voltage 276 across the resistor 272. The voltage 276 may be viewed as a representation of the collector current 232; that is, the voltage 276 may be viewed as a "collector current sense". In turn, the collector current 232 may be viewed as a representation of the output current of the output 222.

When placed in parallel with the resistor 272, the differential amplifier 274 detects the voltage 276 and produces the node voltage 242. To obtain a representation of the output power (dB) of the output 222, the system 200 may further include a logarithmic amplifier 278 between the node 242 and the input 263 of the amplifier 240. The node voltage 242 is passed through the logarithmic amplifier 278 to obtain the voltage 266. If needed, the voltage 266 may be passed through the amplifier 240 to produce the voltage 260.

At the error amplifier 238, the voltage 260 is compared to the input voltage 256 to produce an error voltage 262. The error voltage 262 is then integrated at the loop integrator 244 to create an integrated voltage 280. The integrated voltage 280 is then passed through the current amplifier 246 and applied as the base current Ibase 226 to the base 212.

In addition to the features described above, the controller 206 may further include additional items to improve the operation of the controller 206. For example, the controller 206 may include a pin 282, a band select pin 284, and a feedback toggle pin 286 to supply auxiliary services to the controller 206. The pin 282 may be coupled to a voltage supply 236 to receive the supply current 234. The band select pin 284 may be coupled to a selection feature that permits selection of the band over which the power amplifier 204 is to operate. Moreover, the feedback toggle pin 286 may be coupled to a toggle switch that permits enabling or disabling the feedback controls of the controller 206. Further, the power control voltage 228 may be distributed to the controller 206 through a pin (not shown), where this pin is configured to enable/disable the circuitry of the controller 206.

The controller 206 may also include a voltage clamp 288. The voltage clamp 288 may be part of a circuit that constantly compares the actual base current ("Ibase") 226 (or actual voltage ("Vm")) to a desired current (or command voltage ("Vcmd")), and adjusts the power control voltage 228 to ensure that the actual voltage remains equal to the command voltage. All embodiment of the voltage clamp 288 is discussed below in connection with FIG. 9.

As noted above, the system 200 of FIG. 2 may employ the resistor 272 to develop the voltage 276 as a representation of the collector current 232. Under certain circumstances, the use of the resistor 272 may result in a reduction in efficiency due to a voltage drop across the resistor 272. One solution to minimize this reduction in efficiency is to eliminate the resistor 272 (and the differential amplifier 274) from the system 200 and provide a different technique to obtaining the desired representation of the collector current 232. This different technique, referred to as base current sense with logarithmic feedback, is discussed in connection with FIG. 3.

II. Indirect Sense Power Control Technique: Base Current Sense With logarithmic Feedback The ratio of the total current Ic 232 (FIG. 2) in the collector 214 to the total current Ibase 226 in the base 212 is generally known as the transistor beta B. Under the circumstances where both the power amplifier 204 is operating in an active mode and the transistor beta B remains relatively constant, the base current 226 may be viewed as being directly proportional to the collector current 232. This embodiment of the invention takes advantages of these circumstances and the current proportionality they create by providing an optional path 290 from the base current 226 to the input to the logarithmic amplifier 278 that by-passes the resistor 272. Here, the optional path 290 may be part of a power amplifier output-matching network.

Figure 3:
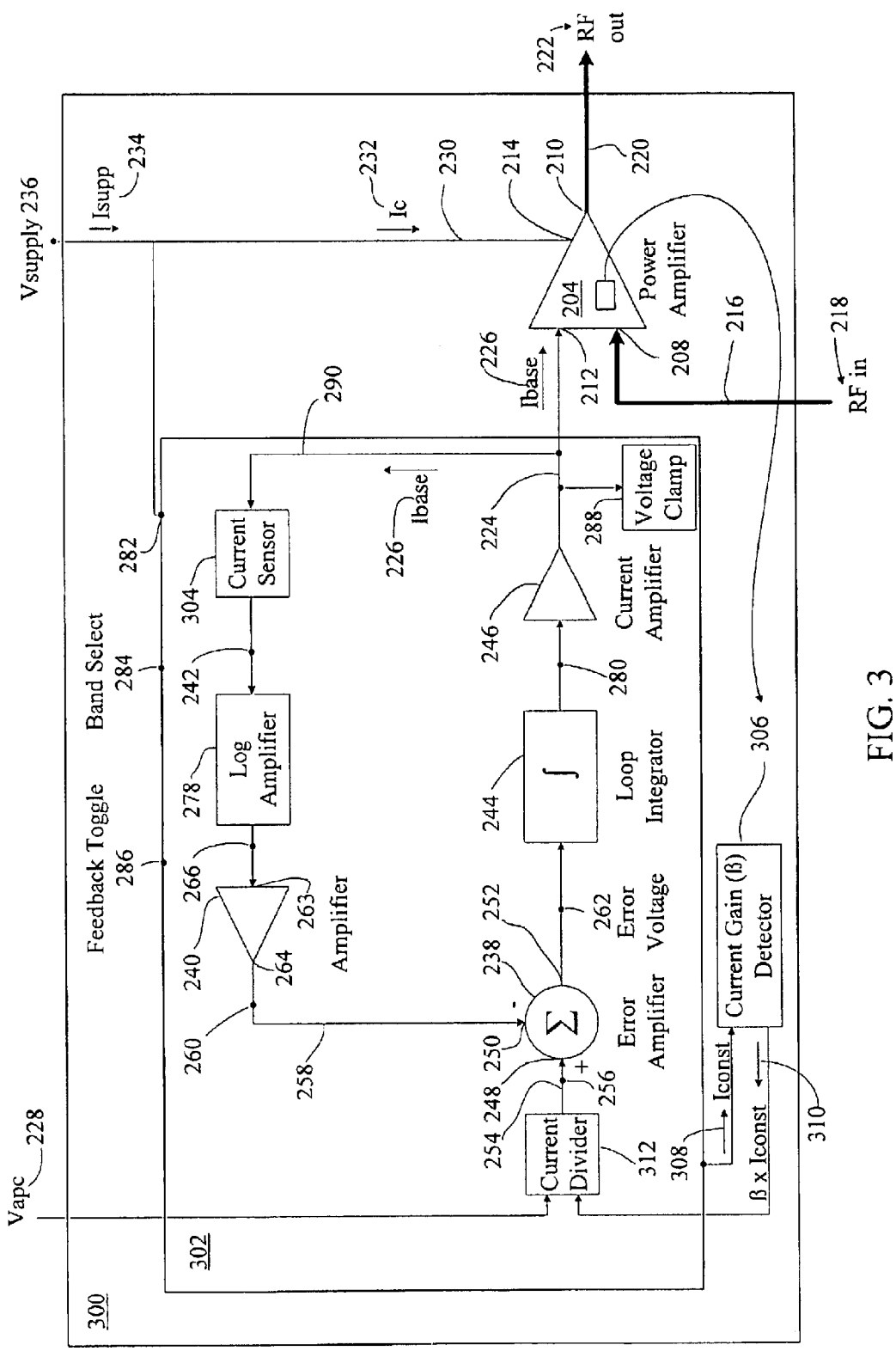
FIG. 3 illustrates a system 300 as an exemplar implementation of the block 100 of FIG. 1.

FIG. 3 illustrates a system 300 as an exemplar implementation of the block 100 of FIG. 1. Included within the system 300 may be the power amplifier 204 and a controller 302 having the error amplifier 238, the loop integrator 244, and the current amplifier 246 coupled to the power amplifier 204. The controller 302 may also include the node 242, the logarithmic amplifier 278, and the amplifier 240 coupled to the second input 250 of the error amplifier 238.

The controller 302 may also include a current sensor 304 disposed between the current amplifier 246 and the node 242 as part of optional path 290. The current sensor 304 may include circuitry to compensate for any variations of beta from constant. Moreover, situated in the power amplifier 204 may be a current gain (beta) detector 306. The current gain (beta) detector 306 may be a direct current (DC) gain correction circuit.

In operation, the current gain (beta) detector 306 may receive a constant current (Iconst) 308 from the controller 302 and output a signal 308, where the signal 308 represents beta times the constant current 308. The signal 308 is fed into a current divider 312. The current divider 312 receives the power control voltage 228 and the signal 310 and produces the input voltage 256 to the error amplifier 238. Additionally, the base current 226 may pass through the current sensor 304 to form the node voltage 242.

Under the circumstances where both the power amplifier 204 is operating in an active mode and the transistor beta B remains relatively constant, the base current 226 may be, for example, approximately 1/100 th of the collector current 232. Thus, the desired representation of the collector current 232 may be obtained by coupling the base current 226 to the input to the logarithmic amplifier 278 through the current sensor 304. By avoiding the use of the resistor 272 as in the embodiment described in connection with FIG. 2, this alternate arrangement of FIG. 3 would eliminate the reduction in efficiency due to a voltage drop across the resistor 272.

Alternatively, the controller 206 of FIG. 2 may be modified to include the current sensor 304 disposed between the current amplifier 246 and the node 242. Here, the controller 206 may further include a pin configured to permit selection of at least one of employing the resistor 272 and the current sensor 304.

Figure 4:
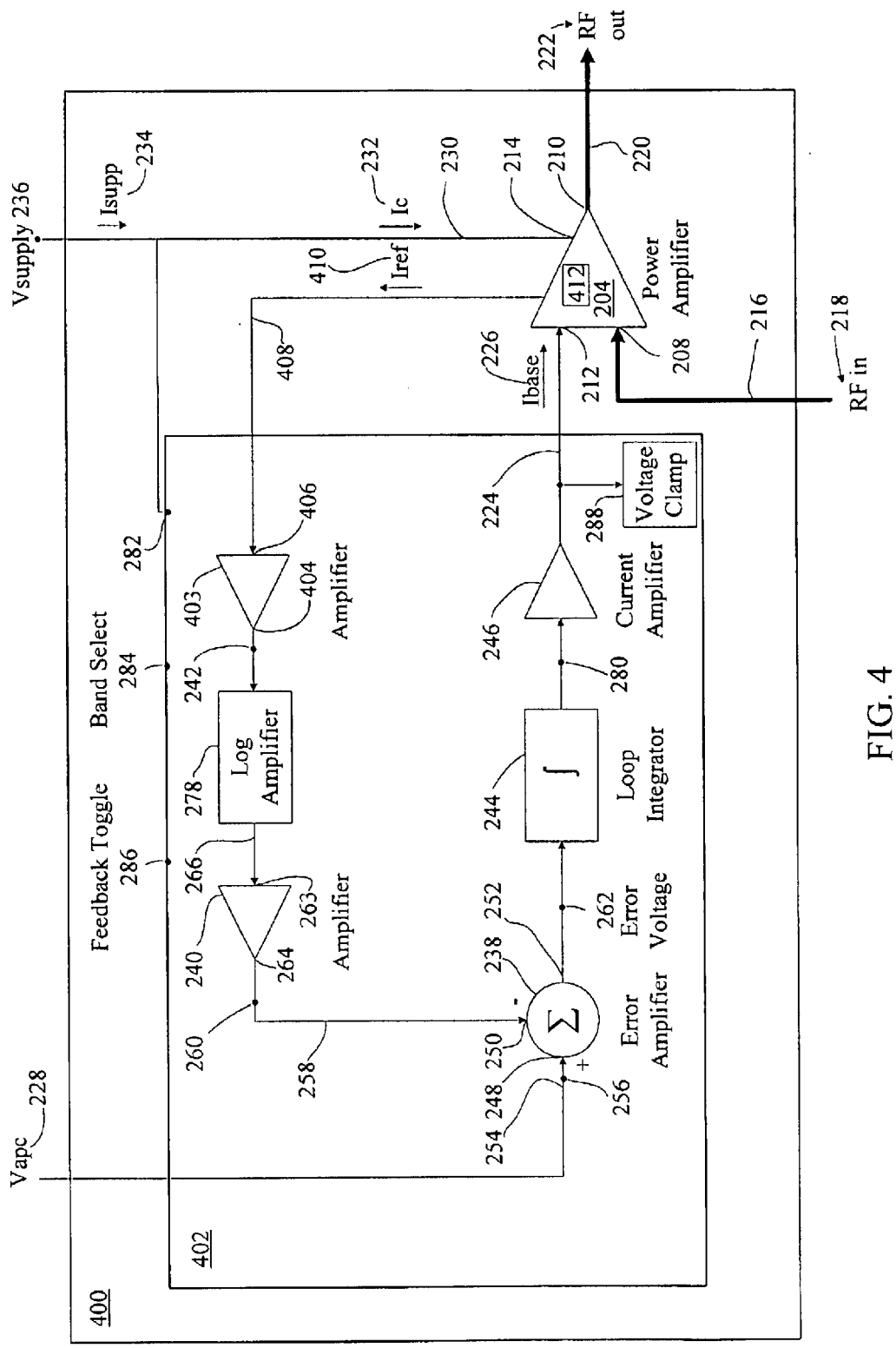
FIG. 4 illustrates a system 400 as an exemplar implementation of the block 100 of FIG. 1.

III. Indirect Sense Power Control Technique: Reference Collector Current Sense With Logarithmic Feedback FIG. 4 illustrates a system 400 as an exemplar implementation of the block 100 of FIG. 1. Where FIG. 2 dealt with collector current sense and FIG. 3 dealt with base current sense, FIG. 4 deals with reference collector current sense. The term reference collector current sense includes a current created by reference to the collector current.

Included within the system 400 of FIG. 4 may be the power amplifier 204 and a controller 402 having the error amplifier 238, the loop integrator 244, and the current amplifier 246 coupled to the power amplifier 204. The controller 402 may also include the node 242, the logarithmic amplifier 278, and the amplifier 240 coupled to the second input 250 of the error amplifier 238.

The system 400 may also include an amplifier 403 having an output 404 coupled to the node 242. The amplifier 403 may also include an input 406 coupled to the power amplifier 204 through a bus 408 to receive a reference current 410. A current mirror may be thought of as any device configured to produce as an output a multiple of an input current. The reference current 410 may be a fraction of the collector current 232. In one embodiment, the reference current 410 is developed from the collector current 232 through the current mirror 412. (For a detailed implementation or the current mirror 412, sec FIG. 14.). In operation, the reference current 410 may pass through the amplifier 403 to for in the node voltage 242 at the node 242.

Alternatively, the controller 206 of FIG. 2 may be modified to include the amplifier 404 disposed between the current amplifier 246 and the node 242. Here, the controller 206 may further include a pin configured to permit selection of at least one of employing the resistor 272 and amplifier 404.

Figure 5:
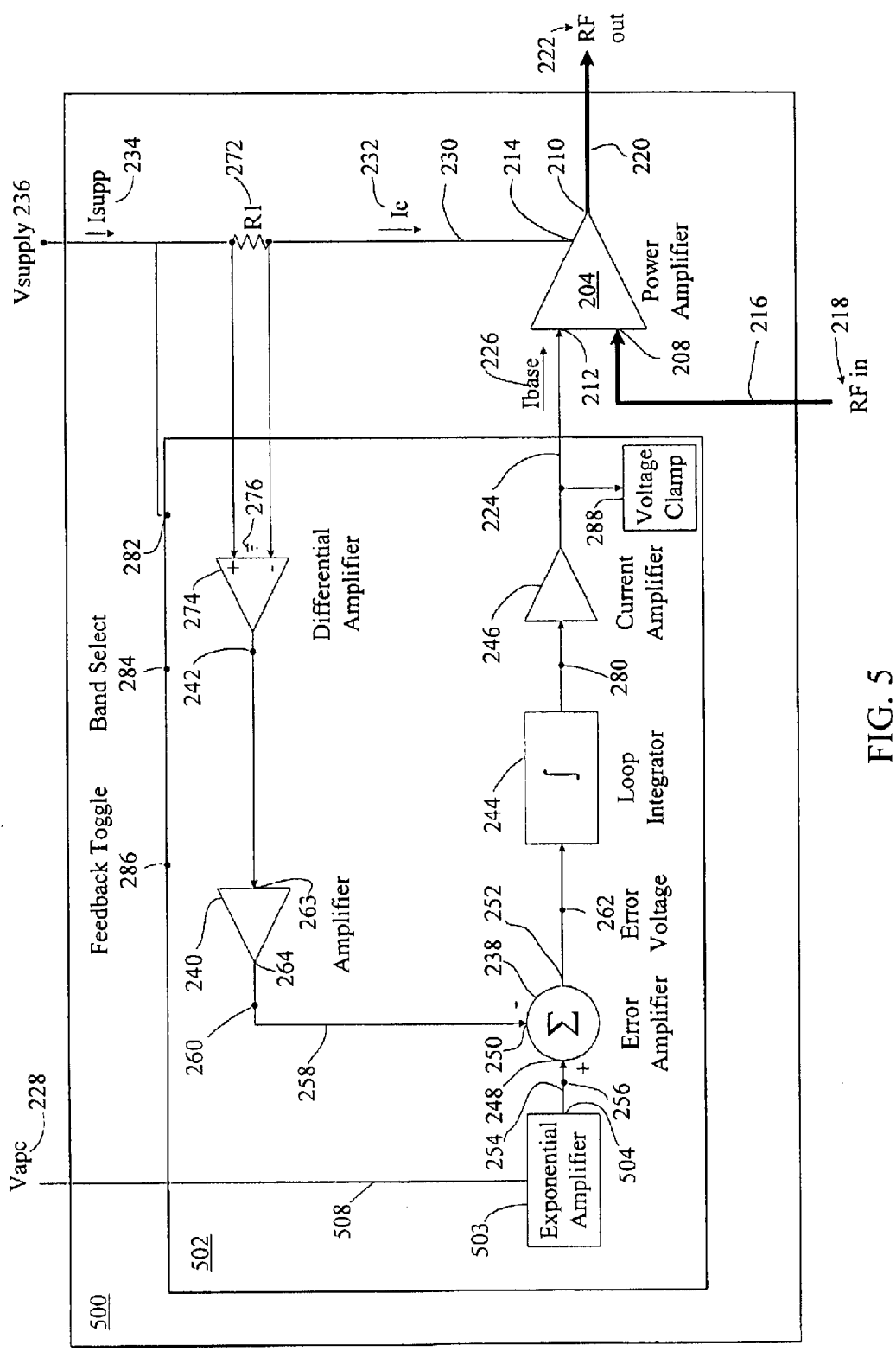
FIG. 5 illustrates a system 500 as an exemplar implementation of the block 100 of FIG. 1.

IV. Indirect Sense Power Control Technique: Collector Current Sense With Logarithmic Feedback and Exponential Control FIG. 5 illustrates a system 500 as an exemplar implementation of the block 100 of FIG. 1. This embodiment varies from the embodiment discussed in connection with FIG. 2 in that exponential control is exerted over the power control voltage 228 to affect the desired collector current sense rather than using logarithmic amplification to affect the desired collector current sense.

Included within system 500 may be the power amplifier 204 and a controller 502. The controller 502 may include the error amplifier 238, the loop integrator 244, and the current amplifier 246 coupled to the power amplifier 204. The controller 502 may also include the differential amplifier 274, the node 242, and the amplifier 240 coupled to the second input 250 of the error amplifier 238. Moreover, the system 500 may include the resistor 272 coupled with the voltage supply 236 and the collector 214 and coupled with the differential amplifier 274.

The system 500 may also include an exponential amplifier 503 having output 504 coupled to first input 248 of the error amplifier 238. The exponential amplifier 503 may also include an input 506 coupled to a bus 508 to receive the power control voltage 228 and produce the input voltage 256.

V. Indirect Sense Power Control Technique: Reference Collector Current Sense With Linear Feedback and Exponential Control This embodiment employs the exponential amplifier 503 of FIG. 5 on the desired collector current sense as developed from a fraction of the collector current 232.

Figure 6:
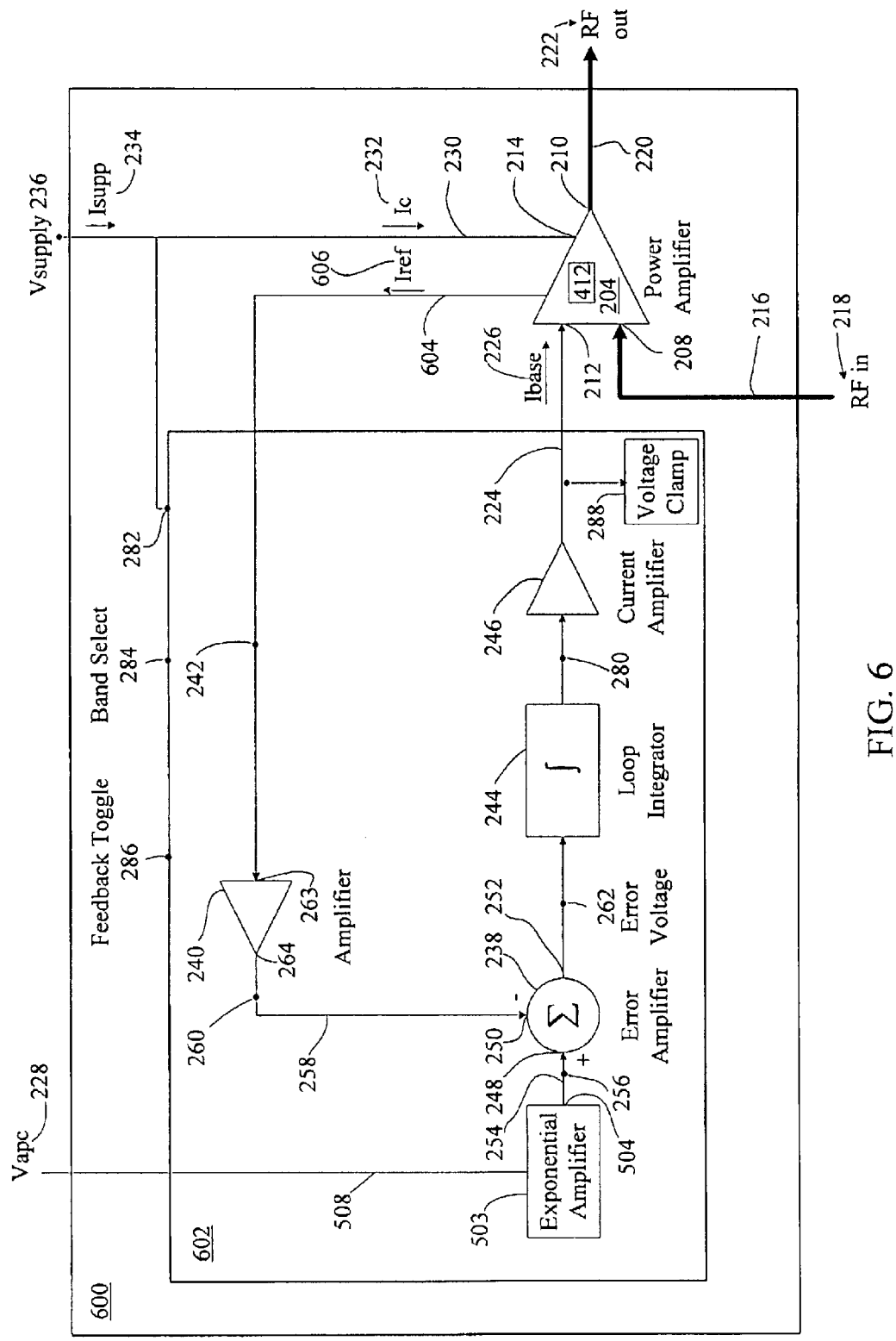
FIG. 6 illustrates a system 600 as an exemplar implementation of the block 100 of FIG. 1.

FIG. 6 illustrates system 600 as an exemplar implementation of the block 100 of FIG. 1. Included within system 600 may be the power amplifier 204, a controller 602, and the exponential amplifier 503 as described in connection with FIG. 5.

Figure 7:
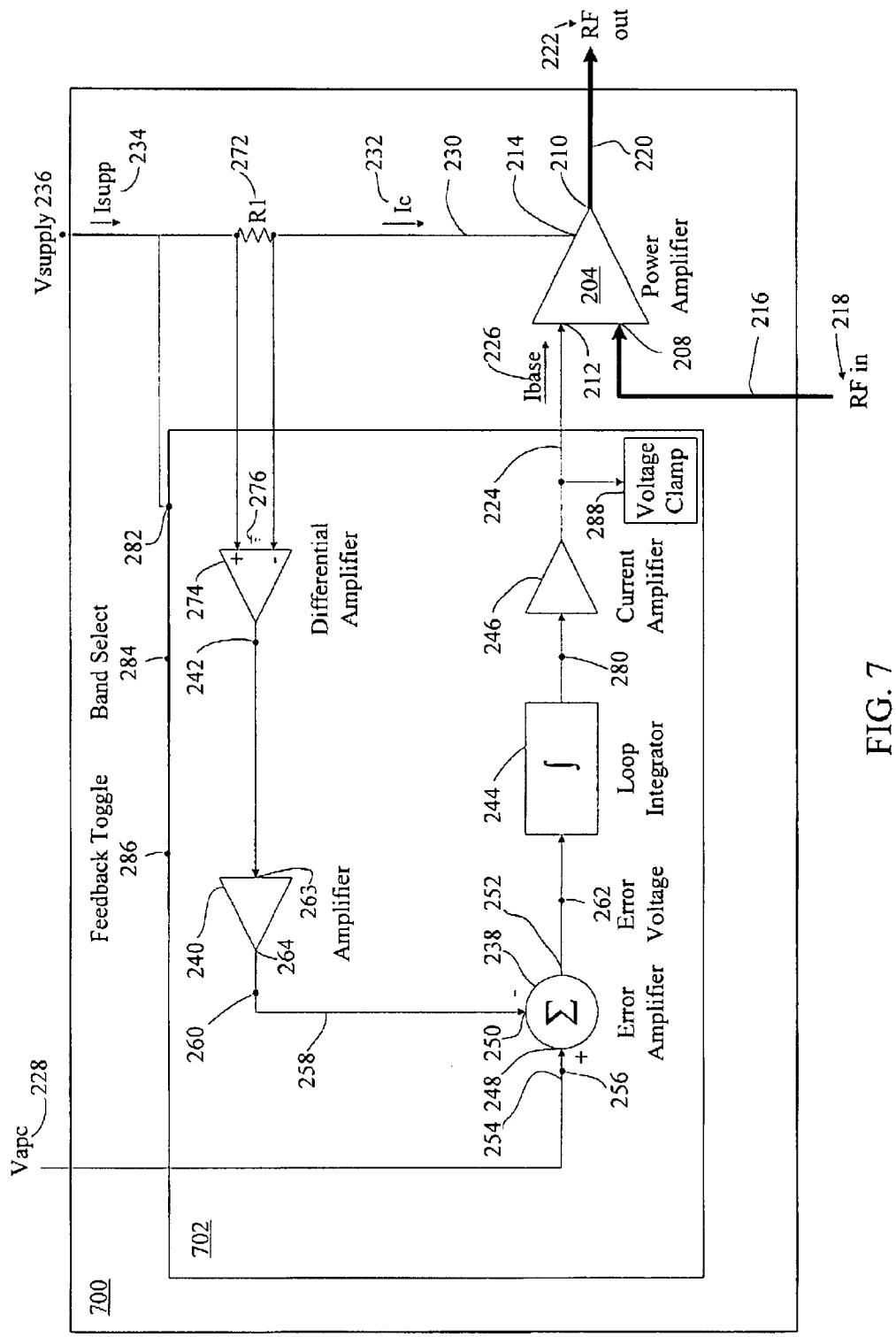
FIG. 7 illustrates a system 700 as an exemplar implementation of the block 100 of FIG. 1.
Figure 8:
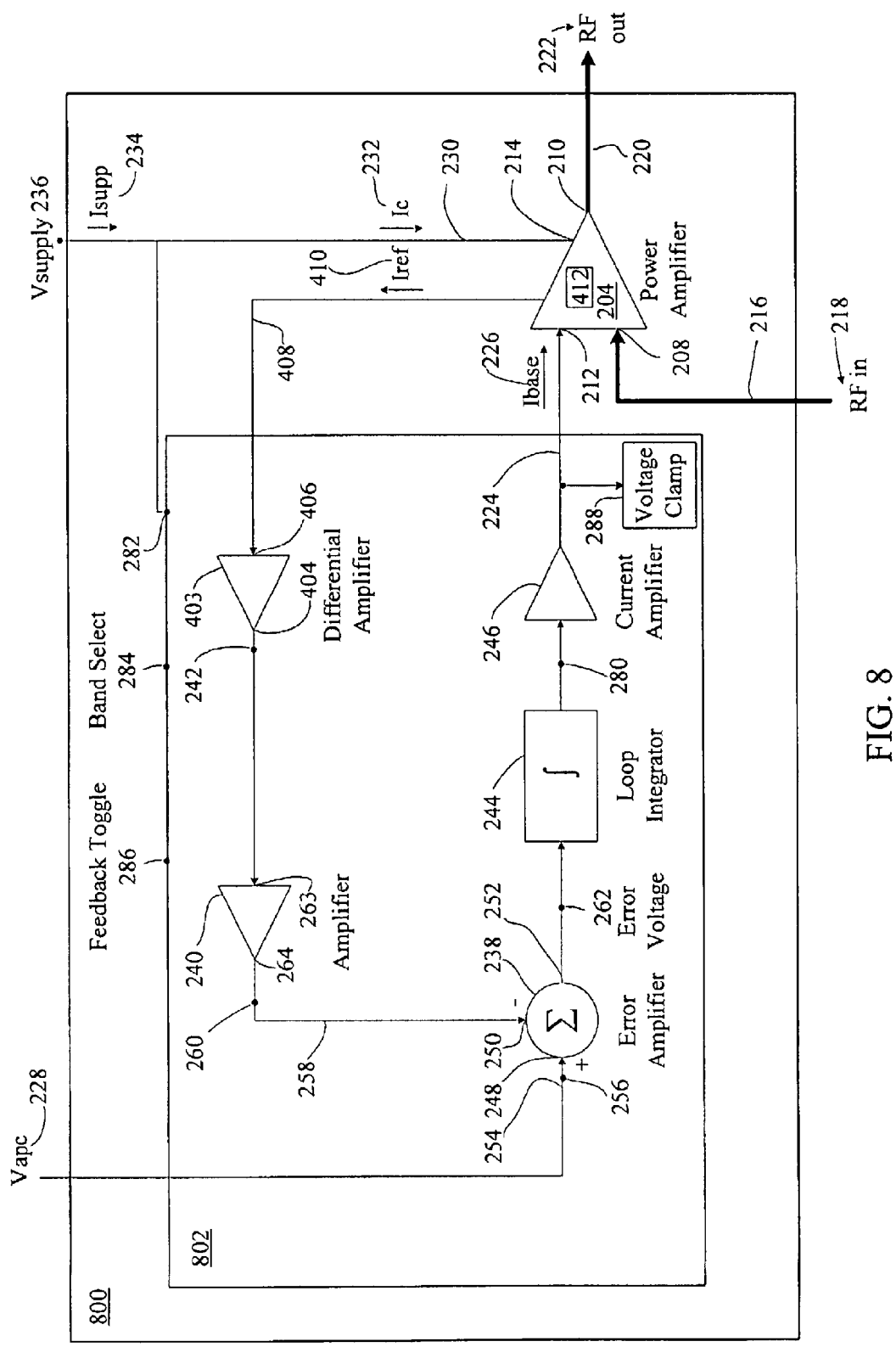
FIG. 8 illustrates a system 800 as an exemplar implementation of the block 100 of FIG. 1.

The controller 602 may include the error amplifier 238, the loop integrator. 244, and the current amplifier 246 coupled to the power amplifier 204. The controller 602 may also include the node 242 and the amplifier 240 coupled in series to the second input 250 of the error amplifier 238. The node 242 may be coupled to the power amplifier 204 through a bus 604 to receive a reference current 606. The bus 604 may be a power/voltage detector coupled to the power amplifier 204 and the amplifier 240 may be a coupler. The reference current 606, similar to the reference current 410 of FIG. 4, may be a fraction of the collector current 232. In one embodiment, the reference current 606 is developed from the collector current 232 through the current mirror 412. (For a detailed implementation of the current mirror FIGS. 1–6 illustrate systems that provide linear output power (in dBs) vs. Vapc voltage power control characteristic. By way of comparison, FIG. 7 and FIG. 8 illustrate systems that provide a logarithmic output power (in dB) vs. Vapc voltage power control characteristic.

VI. Indirect Sense Power Control Technique: Collector Current Sense With Linear Feedback FIG. 7 illustrates a system 700 as an exemplar implementation of the block 100 of FIG. 1. Included within the system 700 may be the power amplifier 204 and the controller 702. The controller 702 may include the error amplifier 238, the loop integrator 244, and the current amplifier 246 coupled to the power amplifier 204. The controller 702 may also include the differential amplifier 274, the node 242, and the amplifier 240 coupled to the second input 250 of the error amplifier 238. Moreover, the system 700 may include the resistor 272 coupled with voltage supply 236 and the collector 214 and coupled in parallel with differential amplifier 274.

This embodiment is similar to the embodiment discussed in connection with FIG. 2 except that this embodiment omits the logarithmic amplifier 278 from the feedback loop.

VII. Indirect Sense Power Control Technique: Reference Collector Current Sense With Linear Feedback FIG. 8 illustrates a system 800 as an exemplar implementation of the block 100 of FIG. 1. Included within the system 800 may be the power amplifier 204 and controller 802. The controller 802 may include tile error amplifier 238, the loop integrator 244, and the current amplifier 246 coupled to the power amplifier 204. The controller 802 may also include the amplifier 403, the node 242, and the amplifier 240 coupled to the second input 250 of the error amplifier 238. The amplifier 403 may receive the reference current 410, where the reference current 410 may be created using the circuit shown in FIG. 14.

VIII. Indirect Sense Power Control Technique: Collector Current Sense With Logarithmic Feedback and Saturation Detection For the reasons described below, a saturated feedback loop is undesirable. By delaying the occurrence of this saturation works to extend the useful operating period of the amplifier/controller systems of the invention. This embodiment addresses delaying feedback loop saturation through saturation detection.

During closed loop operations, such as may be selected through feedback toggle pin 286, the error amplifier 238 compares the logarithm of the collector current (Ic) 232 with the power control voltage (Vapc) 228 to produce an error term, here the error voltage 262. Each change of the collector current 232 or the power control voltage 228 will increase the value of the error voltage 262. Each increase in the error voltage 262 will increase the collector current 232 until the bias of the power amplifier 204 reaches an adequate level.

Under certain circumstances, voltage supplied by the power control voltage 228 may increase. In extreme cases, a sufficiently high power control voltage 228 will result in a value for the collector current 232 that is insufficient to adequately bias the power amplifier 204. This condition will result in a saturated feedback loop. A saturated feedback loop, in turn, will cause the Output 280 of the loop integrator 244 to rail high as well as maintain a value for the error voltage 262 at the input of the loop integrator 244.

Under normal operating conditions, the value for the error voltage 262 will be relatively small. However, in the extreme case noted above, any change in power control voltage 228 (voltage 256) input during the time that the feedback loop is saturated would result in an abrupt transition at the output 280 of the loop integrator 244. This abrupt transition may cause splatter of the spectrum; that is, the pulsing up or down transition at the output 280 may increase in the bandwidth of a signal. Under these circumstances, control through delay may be required to prevent excessive "splatter" upon an abrupt power level transition such as the end of a burst. Delaying the point at which the Output 280 of integrator 244 rails out may be achieved by augmenting the voltage 256 with a saturation detection feedback circuit.

Figure 9:
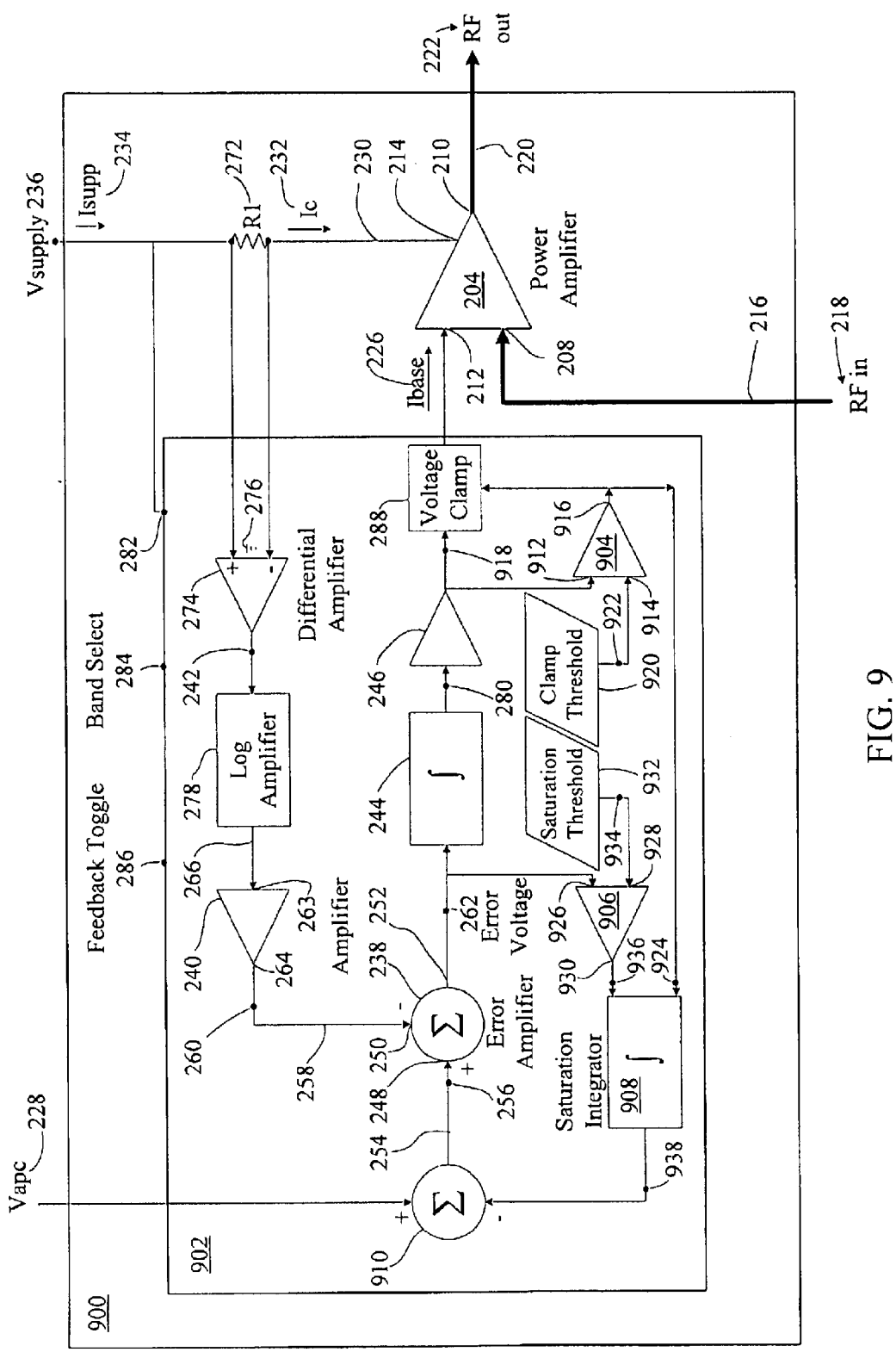
FIG. 9 illustrates a system 900 as an exemplar implementation of the block 100 of FIG. 1.

FIG. 9 illustrates a system 900 as an exemplar implementation of the block 100 of FIG. 1. The system 900 provides the desired collector current sense to a logarithmic feedback loop whose signal is augmented by a saturation detection circuit. By way of explanation and not limitation, the saturation detection circuit monitors the state of the closed loop, and provides an indication when the loop begins to open. Once saturation is detected, a feedback signal adjusts the loop threshold to bring the system 900 to a bias point that allows for closed loop operation. After the saturated condition is eliminated, the loop threshold is returned to its original state.

Included within the system 900 may be the power amplifier 204 and a controller 902. The controller 902 may include the error amplifier 238 placed upstream of and coupled with the current amplifier 246. Although shown with some of the components described in connection with FIG. 2, the system 900 may utilize any power amplifier 204 feedback technique as described in connection with FIGS. 1–8.

The system 900 may be thought of as a closed loop power amplifier controller (CLPAC) feedback with power amplifier saturation detection feedback. With regard to the power amplifier saturation detection feedback, the system 900 may also include the voltage clamp 288, a first logic comparator 904, a second logic comparator 906, a saturation integrator 908, and a comparator 910.

As noted above, the voltage clamp 288 may be part of a circuit that id capable of constantly comparing the actual base current (Ibase) 226 (or actual voltage (Vm)) to a desired current (or command voltage (Vcmd)). From this comparison, the power amplifier saturation detection feedback circuitry associated with the voltage clamp 288 may adjust the power control voltage 228 before entering the error amplifier 238. This adjustment is designed to ensure that the actual voltage remains equal to the command voltage as the output 222 of the power amplifier 204 approaches the ends of the capabilities of the power amplifier 204 (namely, saturation).

The voltage clamp 288 may be disposed to receive the actual base current (Ibase) 226, such as between an output of the current amplifier 246 and the base 212 of the power amplifier 204. The first logic comparator 904 may include a first input 912, a second input 914, and an output 916 to receive two inputs and to generate and pass along an output signal.

As seen in FIG. 9, the first input 912 may be coupled to the output of the current amplifier 246 to receive as an input voltage 918. The voltage 918 may be an amplification of the output of the loop integrator 244, which in this case is the integrated voltage 280. Alternatively, the first input 912 may be coupled to the output of the loop integrator 244 to receive as an input integrated voltage 280. The second input 914 of the first logic comparator 904 may be coupled to the clamp threshold 920. The clamp threshold 920 may produce the clamp voltage 922. The clamp voltage 922 includes a voltage whose value defines a point at which the power amplifier 204 saturates. In operation, the first logic comparator 904 receives as inputs the voltage 918 and the clamp voltage 922. If the voltage 918 exceeds the clamp voltage 922, the first logic comparator 904 generates a trigger signal 924 and outputs the trigger signal 924 to the saturation integrator 908.

The second logic comparator 906 may include a first input 926, a second input 928, and an output 930 to receive two inputs and to generate and pass along an output signal. As seen in FIG. 9, the first input 926 is coupled to the input of the loop integrator 244 to receive error voltage 262. The second input 928 of the second logic comparator 906 may be coupled to the saturation threshold 932, where the saturation threshold 932 is configured to produce a saturation voltage 934. The saturation voltage 934 includes a voltage whose value defines a point at which the loop integrator 244 saturates.

In operation, the second logic comparator 906 may receive as inputs both the error voltage 262 and the saturation voltage 934. If the error voltage 262 exceeds the saturation voltage 934, the second logic comparator 906 may generate a trigger signal 936 and then output the trigger signal 936 to the saturation integrator 908.

If the saturation integrator 908 receives as an input either the trigger signal 924 or the trigger signal 936, the saturation integrator 908 may integrate the received trigger signal to create an integrated voltage 938. The integrated voltage 938 then may be passed to the comparator 910. The comparator 910 may apply the integrated voltage 938 to the power control voltage (Vapc) 228 so as to modify the power control voltage 228. In other words, if the error voltage 262 exceeds a predetermined threshold of the loop integrator 244 or if the integrated voltage 280 exceeds a predetermined threshold of the power amplifier 204, then either condition will trigger saturation the integrator 908 to augment the power control voltage 228.

A predetermined time constant on the feedback loop associated with the second logic comparator 906 may be set to a value of approximately ten times (10×) a value of a time constant on the feedback loop that is associated with the logarithmic amplifier 278. Based upon a slope of the power control voltage 228, the error voltage 262 may represent approximately 40 mV/dB. Here, the saturation threshold 932 may be set at 3 dB with a 1.5 dB hysteresis so as to correspond to the trigger voltage 934 at 120 mV and a disable at 60 mV.

IX. Method of Operation

Figure 10:
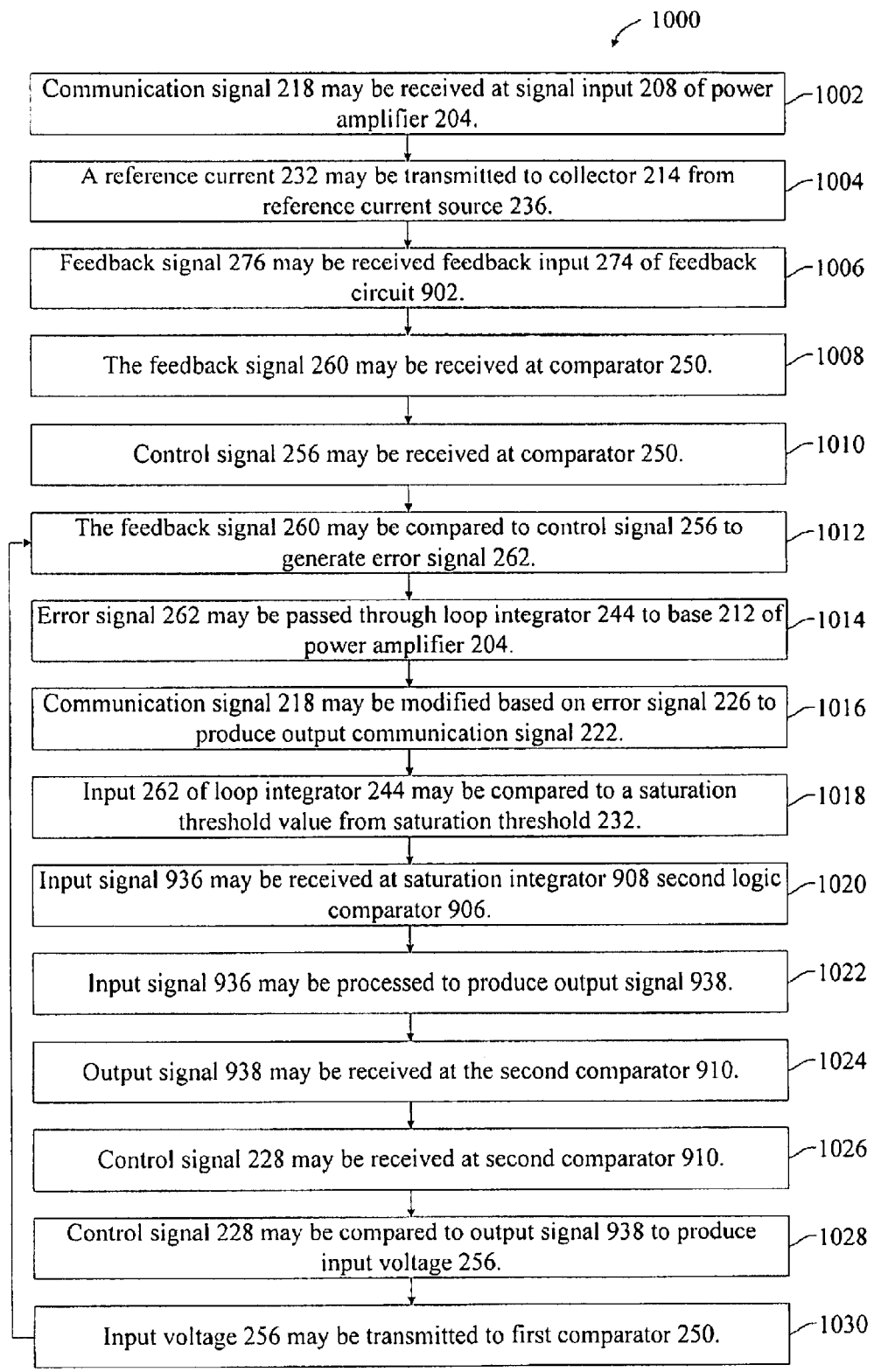
FIG. 10 illustrates an exemplar process of the block diagram of FIG. 1.

FIG. 10 illustrates an exemplar process 1000 of the block diagram of FIG. 1. The process 1000 may employ the system 900 of FIG. 9. At 1002, the communication signal 218 may be received at the signal input 208 of the power amplifier 204. At 1004, a reference current 232 may be transmitted to the collector 214 from the voltage supply 236. At 1006, the feedback signal 276 may be received at the feedback input 274 of the feedback circuit 902.

Receiving the feedback signal 276 at the feedback input 274 may be accomplished by passing the reference current 234 through the resistor 272 as in FIG. 2, by passing the output 280 of the loop integrator 244 into the current sensor 304 as in FIG. 3, or by passing the reference current 232 through the current mirror 412 disposed within the power amplifier 204 as in FIG. 4.

At 1008, the feedback signal 260 may be received at the comparator 250. At 1010, the control signal 256 may be received at the comparator 250. At 1012, the feedback signal 260 may be compared to the control signal 256 to generate the error signal 262. At 1014, the error signal 262 may be passed through the loop integrator 244 to the base 212 of the power amplifier 204. At 1016, the communication signal 218 may be modified based on the error signal 226 to produce the output communication signal 222 at the signal output 210 of the power amplifier 204.

At 1018, the input 262 of the loop integrator 244 may be compared to a saturation threshold value from the saturation threshold 232 in the second logic comparator 906. Alternatively, the output 918 of the loop integrator 244 may be compared to a clamp threshold value from the clamp threshold 920 in the first logic comparator 904.

At 1020, the input signal 936 may be received at the saturation integrator 908 from the second logic comparator 906. At 1022, the input signal 936 may be processed to generate the output signal 938. At 1024, the output signal 938 may be received at the comparator 910. At 1026, the control signal 228 may be received at the comparator 910. At 1028, the control signal 228 may be compared to the output signal 938 to produce the input voltage 256. At 1030, the input voltage 256 may be transmitted to a first comparator 250. From 1030, the method (process) 1000 may return to 1012.

The above closed loop feedback invention includes a variety of advantages over conventional techniques. For example, the invention eliminates the need to include printed circuit board (PCB) traces that carry a base current representation to the system controller. Since the invention is process independent, the transfer function stays the same whether the power amplifier function includes silicon, gallium arsenide, or other technologies.

The saturation detection block works to stabilize the power control voltage 228 irrespective of temperature. By working to stabilize the power control voltage 228 irrespective of temperature, the system 900 works to provide accurate control over the linearity of the output 222 of the power amplifier 204. With the power control voltage 228 stabilized irrespective of temperature, a power amplifier vendor need only perform a two point minimum/maximum power calibration. Thus, the calibration table supplied to a user of the invention may be a relatively straight line between minimum and maximum power. Accordingly, in addition to the invention reducing the temperature calibration steps at the site of the power amplifier vendor, the overhead of the power amplifier user is reduced since the closed loop feedback invention eliminated the need of the user to supply and calibrate a separate power amplifier control chip.

Figure 11:
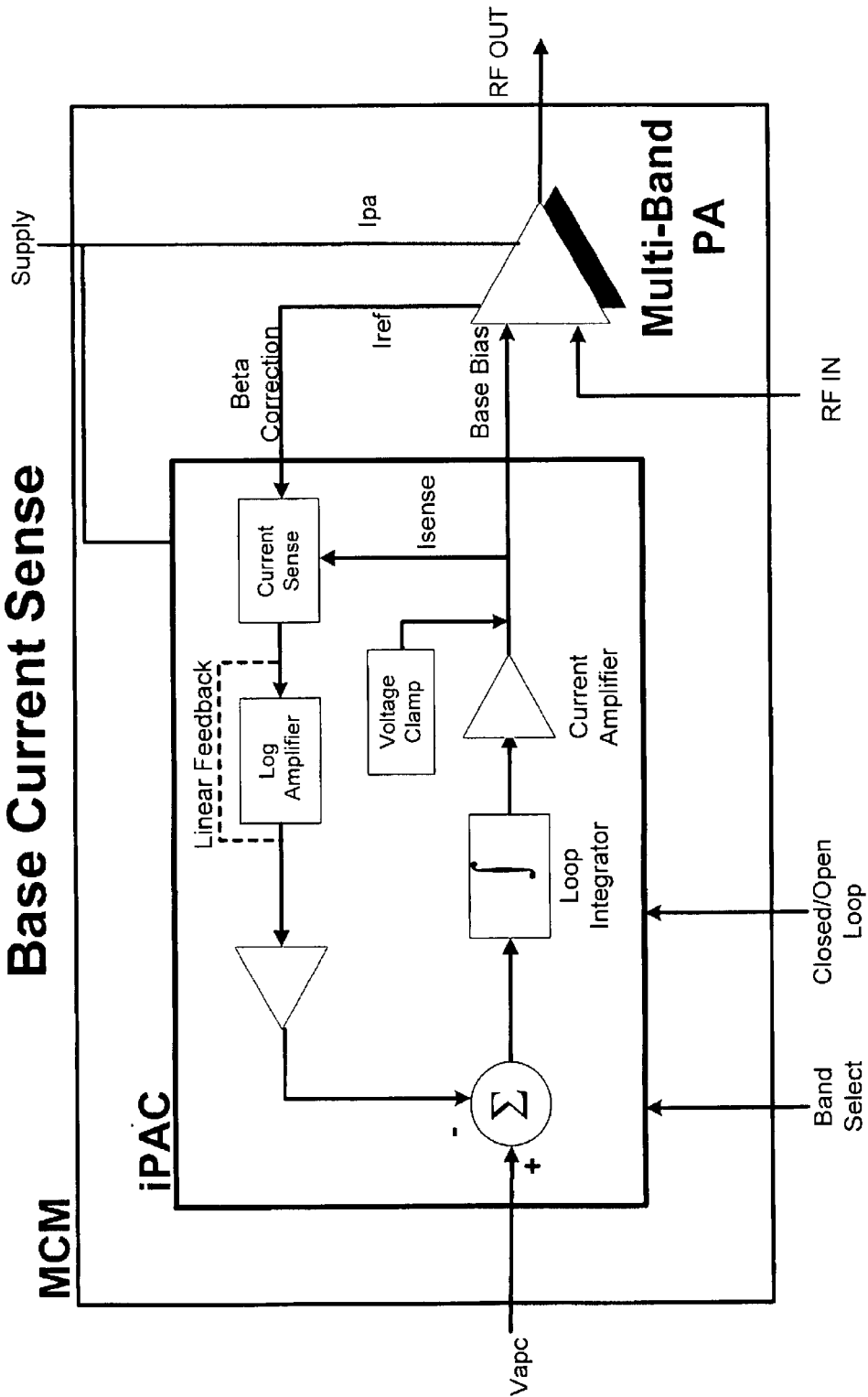
FIG. 11 illustrates log or linear feedback with base current sense and current gain (beta) correction.
Figure 12:
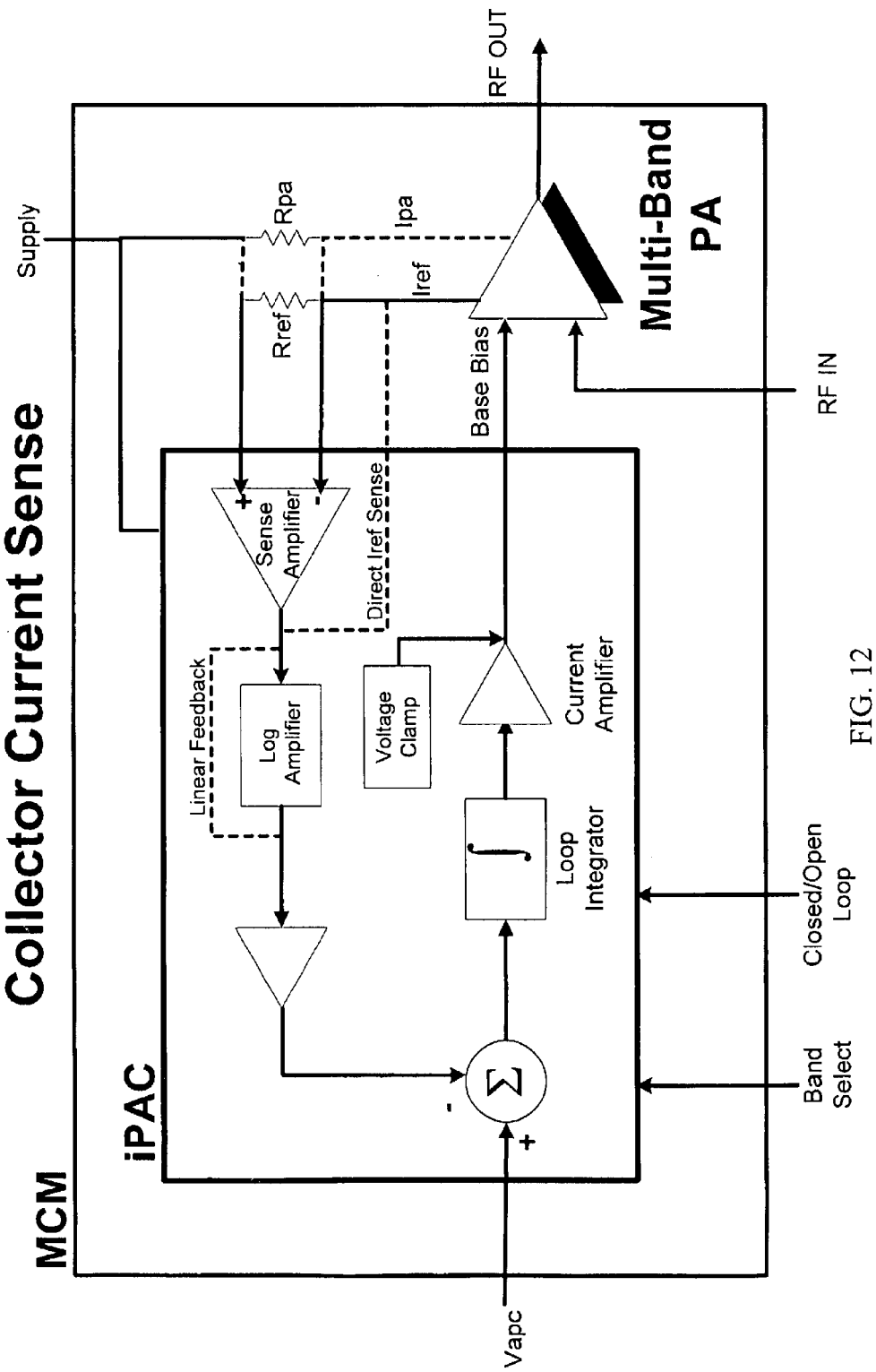
FIG. 12 illustrates log or linear feedback with collector current (Iref or Ipa) sense.
Figure 13:
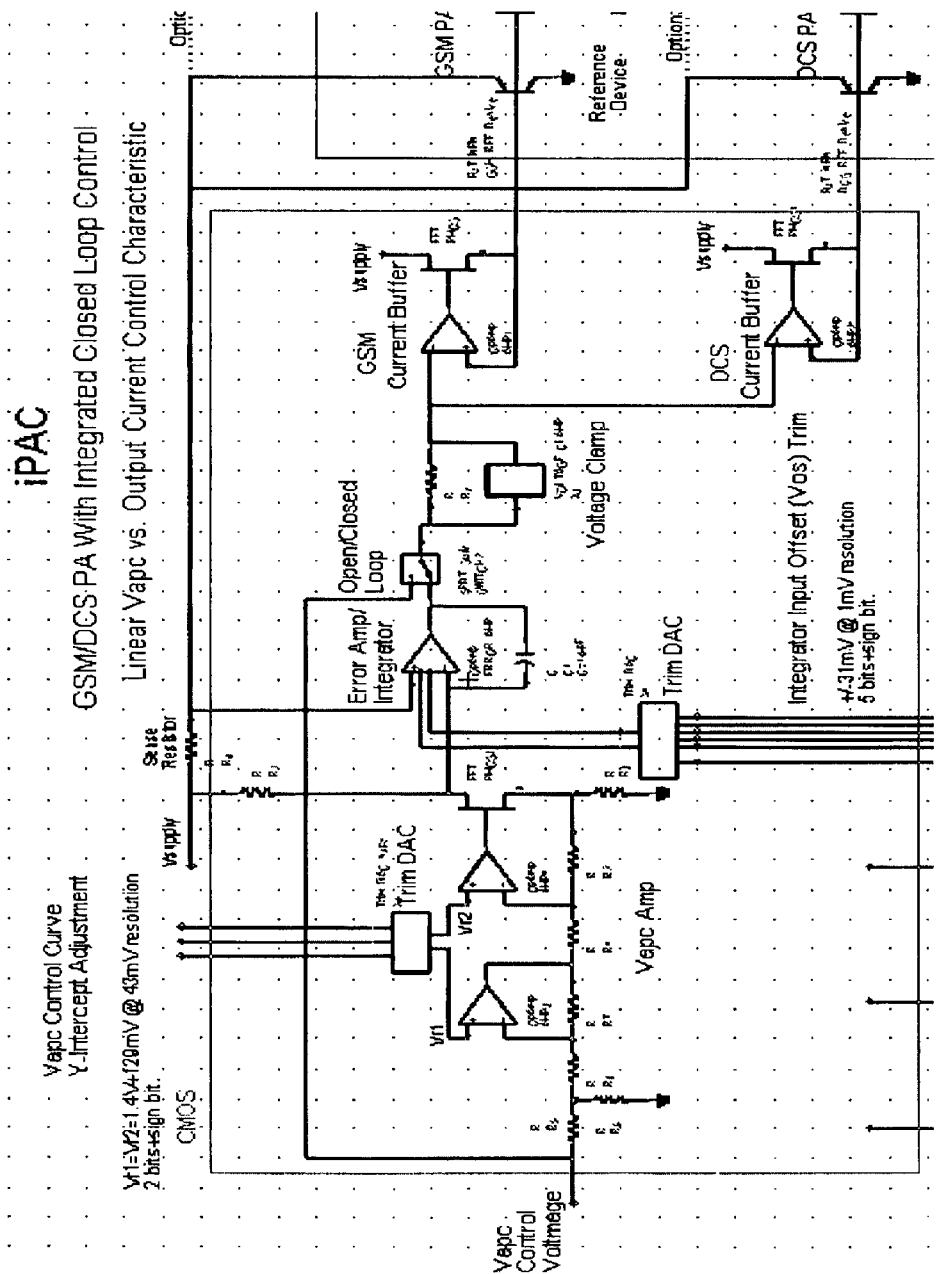
FIG. 13 is a block diagram of a CMOS IC implementation.

FIG. 11 conceptually illustrates alternate paths to create a logarithmic feedback or a linear feedback (dashed lines) with base current sense and current gain (beta) correction. FIG. 12 conceptually illustrates alternate choices from which to obtain the desired collector current sense. FIG. 13 is a block diagram of a complementary metal oxide semiconductor (CMOS) integrated circuit (IC) implementation.

Figure 14:
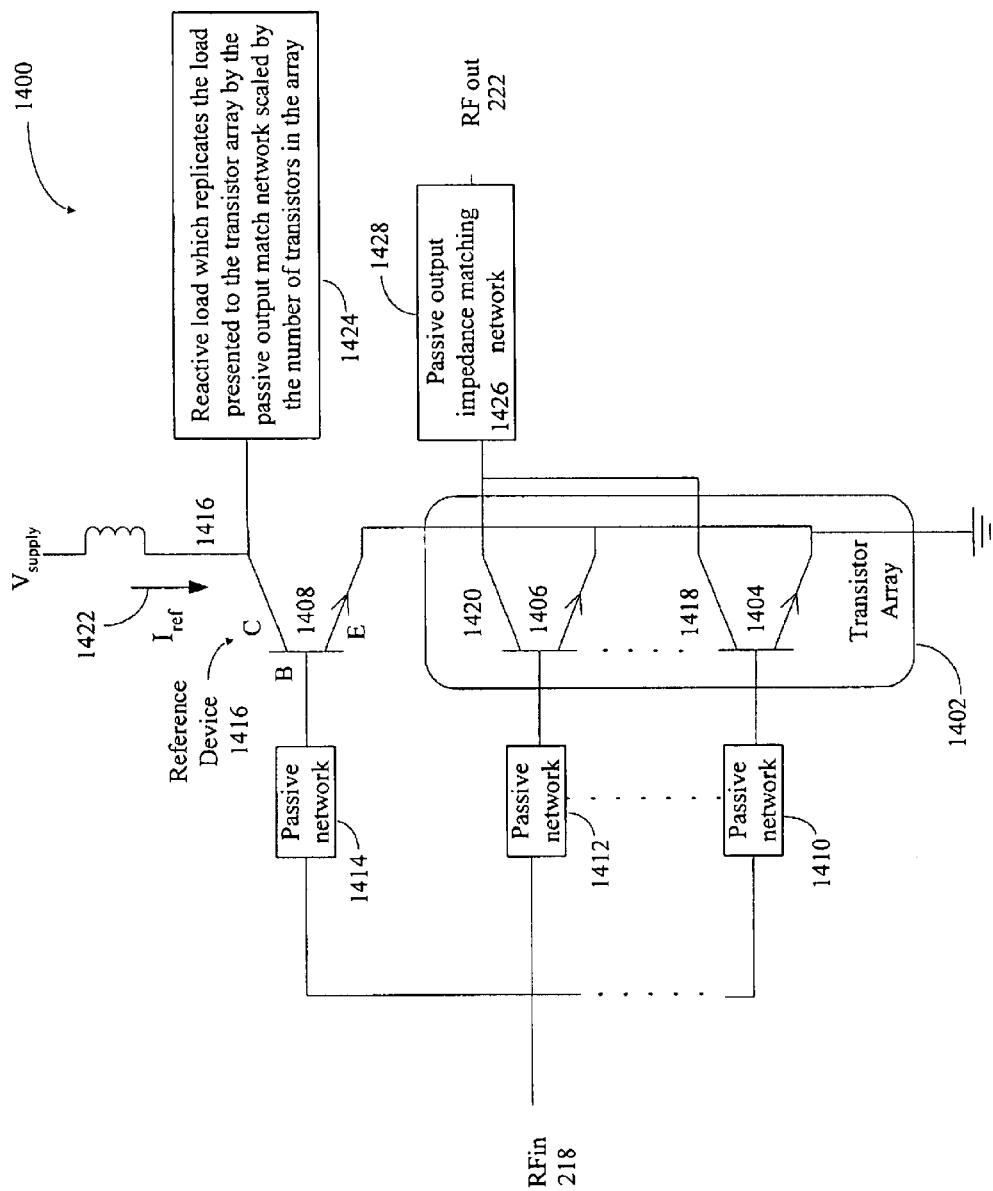
FIG. 14 illustrates a reference current mirror 1400.

FIG. 14 illustrates a reference current mirror 1400. As a mirror device, the reference current mirror 1400 may be may be part of a power amplifier output-matching network. Moreover, the reference current mirror 1400 may be part of the power amplifier 204.

The power amplifier 204 may contain a transistor array 1402 made up of a multiple number N of transistor elements connected in parallel. Examples of the transistor elements include a transistor 1404 and a transistor 1406. The reference current mirror 1400 also includes a reference device 1408, which may be a transistor. The transistor array 1402 may be coupled to passive elements as shown in FIG. 14. These passive elements may include a passive network 1410, a passive network 1412, and a passive network 1414.

The reference device 1408 includes a collector 1416 that is isolated from the collectors 1418, 1420 of tie transistor array 1402. This permits a collector current 1422 to be sensed separate from other collector currents. When loaded appropriately, the collector current 1422 will be a finite fraction of a collector current of the transistor array 1402. 1herefore, the collector current 1422 substantially is proportional to the output power 222. Accordingly, the collector current 1422 may be sensed and used for control of the output power 222.

The reference current mirror 1400 includes a reactive load 1424 that is presented to the reference device 1408. The reactive load 1424 replicates a reactive load impedance 1426 that is presented to the transistor array 1402 by a passive output impedance matching network 1428. The number N of transistors in the transistor array 1402 may scale the impedance of the reactive load impedance 1426.

The exemplary embodiments described herein are provided merely to illustrate the principles of the invention and should not be construed as limiting the scope of the subject matter of the terms of the claimed invention. The specification and drawings are, accordingly, to be regarded in an illustrative rather than a restrictive sense. Moreover, the principles of the invention may be applied to achieve the advantages described herein and to achieve other advantages or to satisfy other objectives, as well.

What is claimed is:

1. A control module comprising:

an amplifier that includes at least one transistor having a plurality of amplifier inputs, where the amplifier is capable of receiving a node signal and an input signal wherein the node signal is a node voltage related to a voltage supply, and the amplifier is further capable or producing a controlled output signal proportional to the input signal, wherein the control is provided by the node signal;

a controller circuit in signal communication with the amplifier capable of receiving a power control voltage and a feedback signal related to the node signal, the controller circuit capable of comparing the node signal to time feedback signal and producing a new node signal resultant from the comparison;

an error amplifier configured to receive the power control voltage and the feedback signal; and a loop integrator in signal communication with the error amplifier and one of the amplifier inputs.

2. The control module of claim 1, further including a resistor coupled between the voltage supply and another of the amplifier inputs, wherein the node voltage has a magnitude equal to a voltage across the resistor.

3. The control module of claim 2, wherein the controller circuit further includes a differential amplifier in signal communication with the error amplifier, the differential amplifier receiving the node signal and producing an a differential amplifier output that is input into the error amplifier.

4. The control module of claim 3, wherein the controller circuit further includes a logarithmic amplifier coupled between the differential amplifier and the error amplifier.

5. The control module of claim 3, wherein the controller circuit further includes an exponential amplifier coupled between the control input and the error amplifier.

6. The control module of claim 3, wherein the controller circuit further includes an amplifier capable of receiving the feedback signal and passing a resulting output to the errors amplifier.

* * * * *